United States Patent Office 3,455,835
Patented July 15, 1969

3,455,835
AZEOTROPIC COMPOSITION

James G. Burt, Oxford, Pa., assignor to E. I. du Pont de Nemours and Company, Wilmington, Del., a corporation of Delaware No Drawing. Filed Apr. 12 1966, Ser. No. 541,969
Int. Cl. C11d 7/50
U.S. Cl. 252—172 3 Claims

ABSTRACT OF THE DISCLOSURE

An essentially constant boiling composition useful for cleaning electrical printed circuit boards comprising from about 54% to about 64% by weight 1,1,2-trichloro-1,2,2-trifluoroethane and about 46% to about 36% trans-1,2-dichloroethylene. The binary azeotrope of 59% 1,1,2-trichloro-1,2,2-trifluoroethane and 41% trans-1,2-dichloroethylene.

This invention is directed to a novel cleaning solvent composition.

The solvent cleaning of complex electronic circuitry, especially printed circuit boards such as those used in television receivers, copying machines, and missile guidance systems, has become increasingly important in recent years. In the manufacture of such printed circuits, the board is usually treated with solder flux prior to the soldering operation. The preferred solder fluxes are organic acids, particularly the rosin acids. On the conclusion of the soldering operation, substantial residues of the flux remain on the board. These residues, if allowed to remain on the board over long periods of time, tend to react with the oxygen of the air and each other to yield conductive materials which interfere with the electrical functioning of the circuit. These printed circuits are so intricate and compact that the only practical method of removing such residual flux and other foreign matter from the circuits is by a solvent cleaning operation.

The solvent cleaning of these circuits is usually carried out in an apparatus well known to those skilled in the art as a vapor degreaser. The procedure for cleaning the soldered circuit board in such apparatus is as follows. First, the board is immersed in the bottom of the degreaser in a slightly agitated solvent bath maintained at or near its boiling point. In the boiling bath, most of the contaminants are dissolved and carried away from the board. Thereafter, to prevent the redeposition of dissolved contaminants on the circuit board left by the evaporation of the residual contaminated solvent, the board is rinsed in pure solvent vapors. The rinsing step is most conveniently accomplished by raising the board into the vapor space above the boiling solvent in the vapor degreaser. In this manner, pure solvent vapor condenses on the circuit board and runs off carrying away the residual contaminated solvent.

Organic solvents, in order to be effective in cleaning circuit boards, must be low boiling, nonflammable, nontoxic, and possess a selective solvent power sufficient to dissolve the contaminants but insufficient to attack the diverse materials making up the circuit board.

Among the solvents useful in cleaning these delicate assemblies, 1,1,2-trichloro-1,2,2-trifluoroethane has received particular attention. This is due to its unique solvent characteristics. 1,1,2-trichlorotrifluoroethane is useful as a cleaning liquid for the removal of contaminants from articles which are themselves sensitive to other, more common and more powerful solvents, such as trichloroethylene and perchloroethylene. One drawback of trichlorotrifluoroethane as a cleaning solvent, however, is that its solvency is often insufficient to remove some contaminants such as, for example, rosin soldering fluxes.

Trans-1,2-dichloroethylene is a much stronger solvent than the 1,1,2-trichlorotrifluoroethane, but it is not commercially acceptable as a solvent since it is flammable.

The present invention is directed, therefore, to a novel solvent cleaning composition possessing azeotropic characteristics and consisting of from about 54% to 64% by weight of 1,1,2-trichlorotrifluoroethane and from about 46% to 36% by weight of trans-1,2-dichloroethylene. An azeotrope is a liquid mixture that exhibits a constant boiling point that may be higher or lower than the boiling points of the separate components. A feature of such a mixture is that its distillate is the same composition as the residue. No change in properties of the mixture occurs as the result of evaporation. No method is known by which the existence of an azeotrope can be predicted.

The mixture of 1,1,2-trichlorotrifluoroethane and trans-1,2-dichloroethylene containing from 36% to 46% by weight of trans-1,2-dichloroethylene has essentially a constant boiling point, i.e., from about 44.09° C. to 44.12° C. Moreover, being essentially constant boiling, the mixtures does not tend to fractionate to any great extent upon evaporation. For those mixtures within he defined invention which depart from the composition of the true binary azeotrope, only a small difference exists after evaporation between the compositions of the vapor phase and the compositions of the initial liquid phase. This difference is so insignificant that the compositions of the vapor phase and liquid phase are considered essentially identical. Hence, any mixture within this define range exhibits properties which are characteristic of a true binary azeotrope. The composition consisting of about 41% by weight of trans-1,2-dichloroethylene and 59% of 1,1,2-trichlorotrifluoroethane and boiling at 44.09° C. at one atmosphere has been established within the accuracy of the boiling point determination procedure as the true binary azeotrope. The true binary azeotrope is the preferred solvent composition of the present invention.

Where a solvent cleaning composition consisting of a mixture of two solvents is to be used in a vapor degreaser as hereinbefore discussed, it is essential that the solvent mixture have essentially the same properties wherever it comes into contact with the object being cleaned. The only solvent mixture which can meet this requirement is one that is azeotropic. The necessity of having an azeotropic solvent is apparent for two reasons. First of all, if the solvent were to fractionate, the danger of flammability in the degreaser would be markedly increased. Secondly, if the solvent fractionates, an undesirable difference in solvent power between liquid and vapor phase would be created in the system. Furthermore, the existence of an azeotrope simplifies separating the solvent from the contaminants and recovering the solvent in the form of its original composition for reuse.

Existence of the azetrope is shown in Table I.

TABLE I.—NORMAL BOILING POINTS OF MIXTURES OF TRANS-1,2-DICHLOROETHYLENE AND 1,1,2-TRICHLOROTRIFLUOROETHANE

| Weight percent trans-1,2-dichloroethylene: | Normal boiling point, ° C. |
|---|---|
| 0 | 47.61 |
| 1.5 | 47.11 |
| 4.7 | 46.38 |
| 8.3 | 45.72 |
| 16.4 | 44.83 |
| 24.4 | 44.38 |
| 31.9 | 44.14 |
| 34.6 | 44.13 |
| 36.0 | 44.12 |
| 40.2 | 44.10 |

| | |
|---|---|
| 45.0 | 44.10 |
| 46.0 | 44.12 |
| 48.1 | 44.15 |
| 51.1 | 44.16 |
| 55.5 | 44.26 |
| 100.0 | 48.33 |

The azeotropic compositions of the present invention make appropriate cleaning compositions since they are low boiling, nonflammable, and nontoxic. In order to determine nonflammable characteristics of the present composition, tests were made by the open-cup method (ASTM Method D–1310–63) for flash points on various compositions within the present invention. The specific compositions employed and the results obtained are set forth in Table II below.

TABLE II

| Trans-1,2-dichloroethylene, weight percent | 1,1,2-trichloro-1,2,2-trifluoroethane, weight percent | Flash point, ° C. |
|---|---|---|
| 5.0 | 95.0 | None to the boiling point. |
| 36.0 | 64.0 | Do. |
| 41.0 | 59.0 | Do. |
| 46.0 | 54.0 | Do. |
| 50.0 | 50.0 | Do. |

Although it was to be expected that a mitxure of these two solvents would be useful as a cleaning solvent, it was totally unexpected that a binary azeotrope would exist or be so effective in removing contaminants such as the rosin soldering fluxes. The rosin acids which are commonly used as solder fluxes as heretofore discussed are readily soluble in the azeotropic compositions of this invention, but are insoluble in the solvent 1,1,2-trichlorotrifluoroethane. It was also unexpectedly found that the binary azeotropic solvent cleaning compositions of this invention did not attack the sensitive articles or materials in the circuits which are known to be attacked by strong solvents such as trans-1,2-dichloroethylene. The unexpected solvent power of the binary azeotrope of trans-1,2-dichloroethylene and 1,1,2-trichlorotrifluoroethane is demonstrated by the following table. The binary azeotrope composition of the present invention was tested for kauri-butanol number as well as the two components of the azeotrope. Kauri-butanol number is the number of milliliters of solvent required to cause cloudiness when added to 20 grams of a solution of kauri gum in butyl alcohol. The solution is prepared in the proportion of 100 grams of kauri in 500 grams of butyl alcohol. The kauri-butanol numbers are given in Table III below as well as the solubility of rosin and condenser wax in the solvent compositions.

TABLE III.—SOLVENT POWER OF MIXTURES OF TRANS-1,2-DICHLOROETHYLENE AND 1,1,2-TRICHLOROTRIFLUOROETHANE

| Weight percent trans-1,2-dichloroethylene | Kauri-butanol number | Solubility of rosin | Solubility of condenser wax |
|---|---|---|---|
| 0 | 31 | Insoluble | No attack. |
| 41 | 63 | Soluble | Do. |
| 100 | 102 | do | Dissolved. |

From the above, it is readily seen that the subject azeotrope is of sufficient solvent power to dissolve the rosin solder flux on the printed electrical circuits without attacking or dissolving one of the more sensitive components of the board, i.e., the wax coating on the condensers.

A representative example demonstrating the usefulness of the subject binary azeotrope as a solvent for cleaning printed electrical circuits follows. All parts are by weight unless otherwise specified.

Example

Two hundred ten parts of trans-1,2-dichloroethylene and 295 parts of 1,1,2-trichlorotrifluoroethane were combined in a vapor degreaser. A printed circuit board for a television receiver was manufactured using rosin-based solder flux. The printed television circuit board was immersed in the boiling solvent at the bottom of the vapor degreaser for eight minutes until the used solder flux was dissolved and thereafter the board was raised into the vapor space for three minutes wherein it was rinsed by condensing vapor. The board was examined under 20× microscope to determine cleanliness. From all appearances, the circuit board was free of visual contaminants.

The board was thereafter treated with water and the water tested for chloride ion content with silver nitrate with negative results.

It is to be understood that the preceding example is representative and that said example may be varied within the scope of the total specification, as understood by one skilled in the art, to produce essentially the same results.

As many widely different embodiments of this invention may be made without departing from the spirit and scope thereof, it is to be understood that this invention is not limited to the specific embodiments thereof except as defined in the appended claims.

The embodiments of the invention in which an exclusive property or privilege is claimed are defined as follows:

1. An azeotropic composition consisting of from about 54% to 64% by weight of 1,1,2-trichlorotrifluoroethane and from 46% to 36% by weight of trans-1,2-dichloroethylene.

2. The binary azeotrope composition of claim 1 wherein the weight of 1,1,2-trichlorotrifluoroethane is 59% and the weight of trans-1,2-dichloroethylene is 41%.

3. In a process for cleaning electrical printed circuit boards in a vapor degreaser, the improvement which comprises using as a cleaning solvent the azeotropic composition of claim 1.

References Cited

UNITED STATES PATENTS 3,349,039 10/1967 Renault ............ 252—172

LEON D. ROSDOL, Primary Examiner

W. SCHULZ, Assistant Examiner

U.S. Cl. X.R.

134—37; 252—67, 364